United States Patent
Ku et al.

(10) Patent No.: US 9,759,746 B2
(45) Date of Patent: Sep. 12, 2017

(54) PROBE MODULE

(71) Applicant: MPI CORPORATION, Zhubei (TW)

(72) Inventors: Wei-Cheng Ku, Zhubei (TW); Hao Wei, Zhubei (TW); Shin-Lan Kao, Zhubei (TW)

(73) Assignee: MPI CORPORATION, Zhubei (TW)

( * ) Notice: Subject to any disclaimer, the term of this patent is extended or adjusted under 35 U.S.C. 154(b) by 303 days.

(21) Appl. No.: 14/558,558

(22) Filed: Dec. 2, 2014

(65) Prior Publication Data
US 2015/0168447 A1 Jun. 18, 2015

(30) Foreign Application Priority Data

Dec. 13, 2013 (TW) .............................. 102146096 A

(51) Int. Cl.
G01R 31/20 (2006.01)
G01R 3/00 (2006.01)
G01R 1/067 (2006.01)
G01R 1/18 (2006.01)

(52) U.S. Cl.
CPC ........... *G01R 3/00* (2013.01); *G01R 1/06772* (2013.01); *G01R 1/18* (2013.01)

(58) Field of Classification Search
CPC .. G01R 1/18; G01R 1/07342; G01R 1/06711; G01R 1/06705; G01R 31/2886; G01R 31/2889; G01R 31/001; G01R 31/2801
USPC .................................................. 324/750.26
See application file for complete search history.

(56) References Cited

U.S. PATENT DOCUMENTS

| | | | | |
|---|---|---|---|---|
| 7,198,501 B1* | 4/2007 | Tsai | ..................... | H05K 7/1431 439/326 |
| 7,498,829 B2* | 3/2009 | Gleason | ............. | G01R 1/07342 324/750.26 |
| 2006/0043959 A1* | 3/2006 | Cavoretto | .............. | G01R 1/067 324/72.5 |
| 2006/0208752 A1* | 9/2006 | Tanioka | ............. | G01R 1/07342 324/755.01 |
| 2012/0274347 A1* | 11/2012 | Wang | ................. | G01R 1/06772 324/755.02 |
| 2012/0315802 A1* | 12/2012 | Blakborn | ............. | H01R 13/113 439/700 |

* cited by examiner

*Primary Examiner* — Tung X Nguyen
*Assistant Examiner* — Dominic Hawkins
(74) *Attorney, Agent, or Firm* — Tracy M. Helms; Apex Juris, pllc.

(57) ABSTRACT

A probe module, which is provided between a tester and a DUT for transmitting electrical signals therebetween, includes a signal transmitting member, a plurality of probes, a positioning member, and a signal connector. The signal transmitting member has a circuit and two grounding. The probes are electrical connected to the circuit and the groundings of the signal transmitting member. The positioning member is made of an insulating material, and provided on the probes. The signal connector is adapted to be electrically connected to the tester, wherein the signal connector has a signal transmission portion and a grounding portion; the signal transmission portion is electrically connected to the circuit of the signal transmitting member, and the grounding portion is electrically connected to the at least one grounding of the signal transmitting member.

6 Claims, 4 Drawing Sheets

PROBE MODULE

BACKGROUND OF THE INVENTION

1. Technical Field

The present invention relates to an electrical testing device, and more particularly to a probe module having the function of collision avoidance.

2. Description of Related Art

Probe card is the commonest device to test the electrical connection of the electronic devices, such as semiconductor chip, IC, or other circuits. The conventional probe card is electrically connected to a device under test (DUT) and a tester respectively to transmit electrical signals therebetween. The conventional tester includes vertical type or desktop type. The probe card is mounted on the tester to touch specified pads of the DUT.

In the test, the test signal is generated in the tester, and transmitted to the signal probe through a core of a signal connector and a signal circuit of a signal transmitting member on a circuit board, and then the test signal is transmitted to DUT when the signal probe touches the pad of the DUT. The signal then will be transmitted back to the tester though a ground probe, a grounding circuit of the signal transmitting member, and a shield of the signal connector. As a result, the signal could be tested in the tester.

After test, the probe card is disassembled and put at a place, such as on the desk. Sometime, it may damage tips of the probes. Therefore, it needs a specified holder to place the probe card. The holder takes space and make the cost increasing.

BRIEF SUMMARY OF THE INVENTION

In view of the above, the primary objective of the present invention is to provide a probe module, which has the function of collision avoidance, and reduce the cost.

In order to achieve the objective of the present invention, a probe module, which is provided between a tester and a DUT for transmitting electrical signals therebetween, includes a signal transmitting member, a plurality of probes, a positioning member, and a signal connector. The signal transmitting member has a circuit and at least one grounding. The probes are made of a conductive material, and electrical connected to the circuit and the at least one grounding of the signal transmitting member respectively. The probes are adapted to touch the DUT. The positioning member is made of an insulating material, and provided on the probes. The signal connector is adapted to be electrically connected to the tester, wherein the signal connector has a signal transmission portion and a grounding portion; the signal transmission portion is electrically connected to the circuit of the signal transmitting member, and the grounding portion is electrically connected to the at least one grounding of the signal transmitting member.

With such design, the probes are firmly held by the positioning member to avoid the shifting problem.

BRIEF DESCRIPTION OF THE SEVERAL VIEWS OF THE DRAWINGS

The present invention will be best understood by referring to the following detailed description of some illustrative embodiments in conjunction with the accompanying drawings, in which.

DETAILED DESCRIPTION OF THE INVENTION

Figure 1:
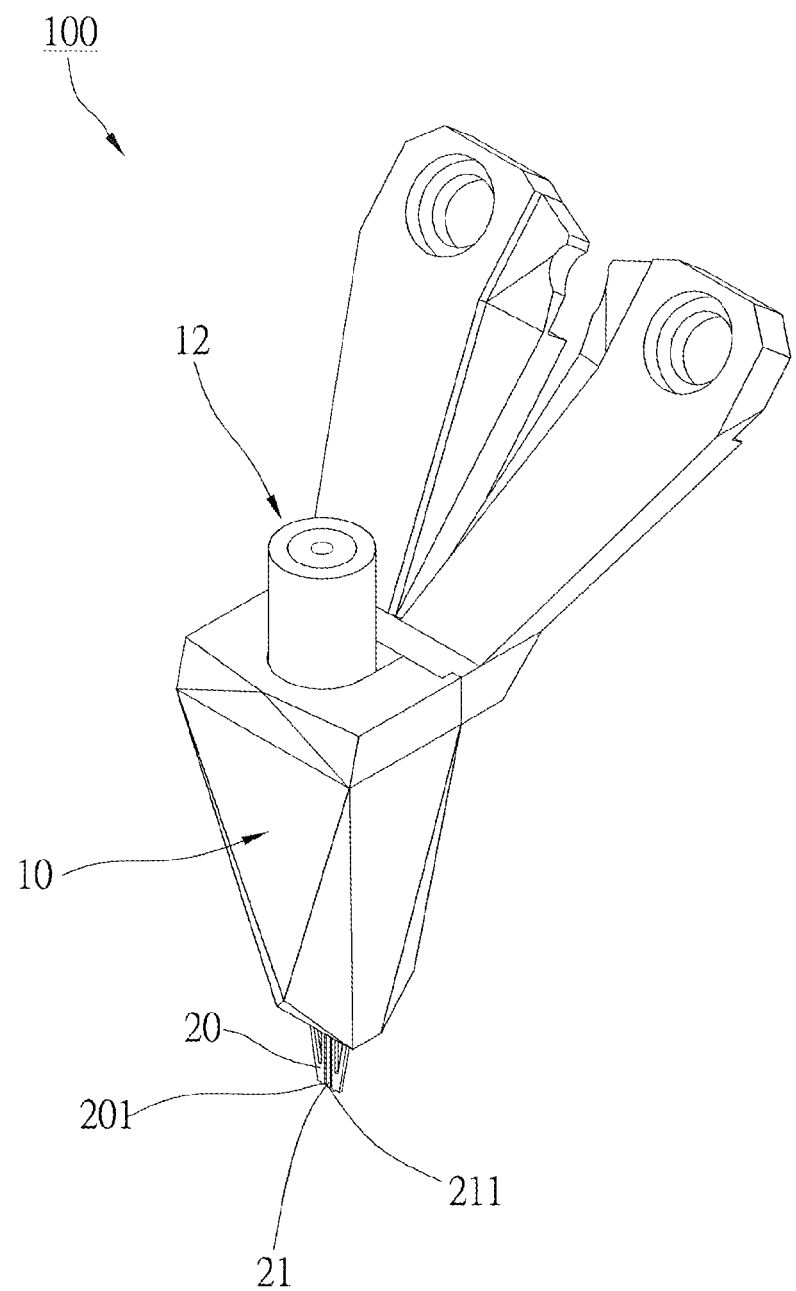
FIG. 1 is a perspective view of a preferred embodiment of the present invention.
Figure 2:
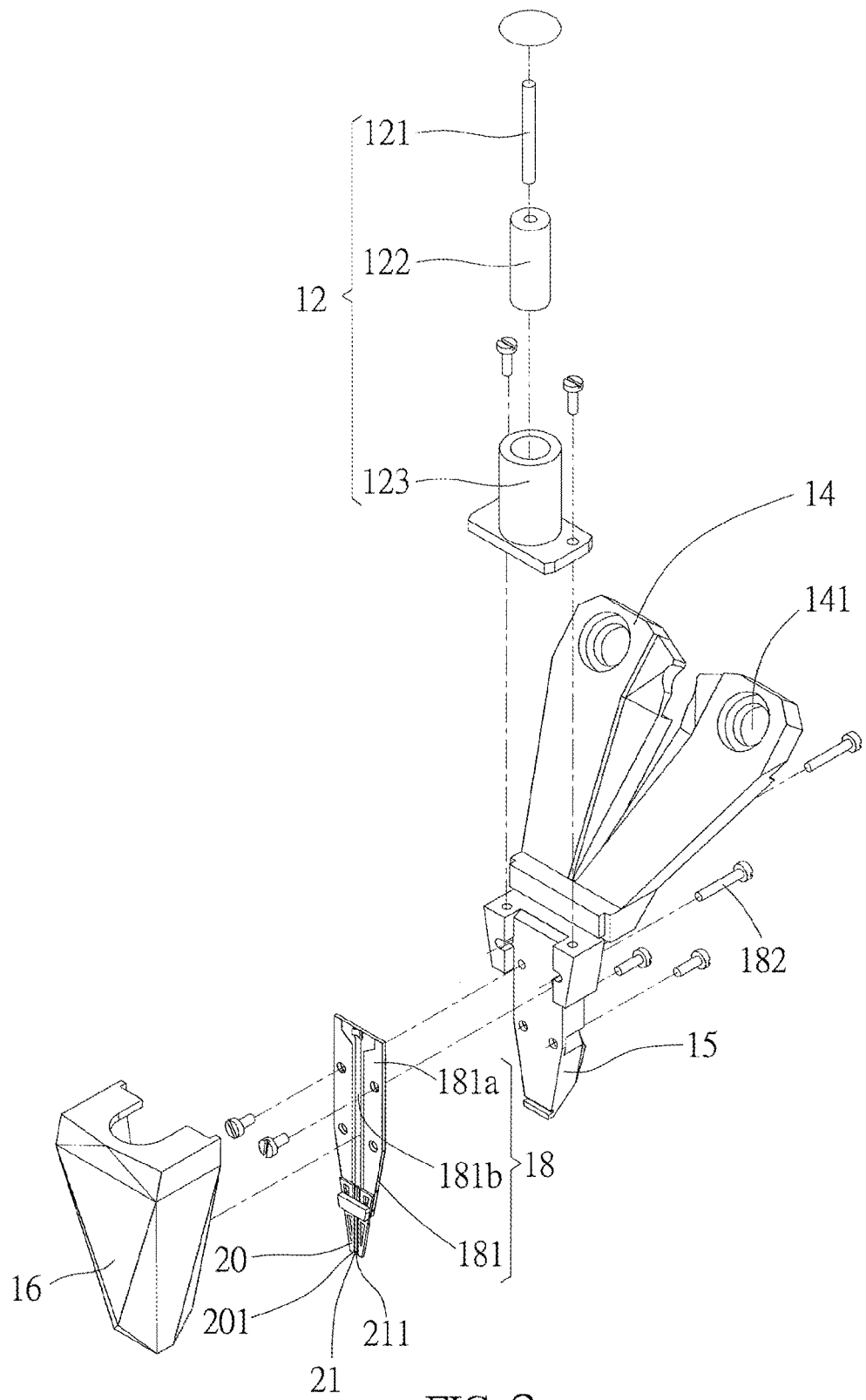
FIG. 2 is an exploded view of the preferred embodiment of the present invention.
Figure 3:
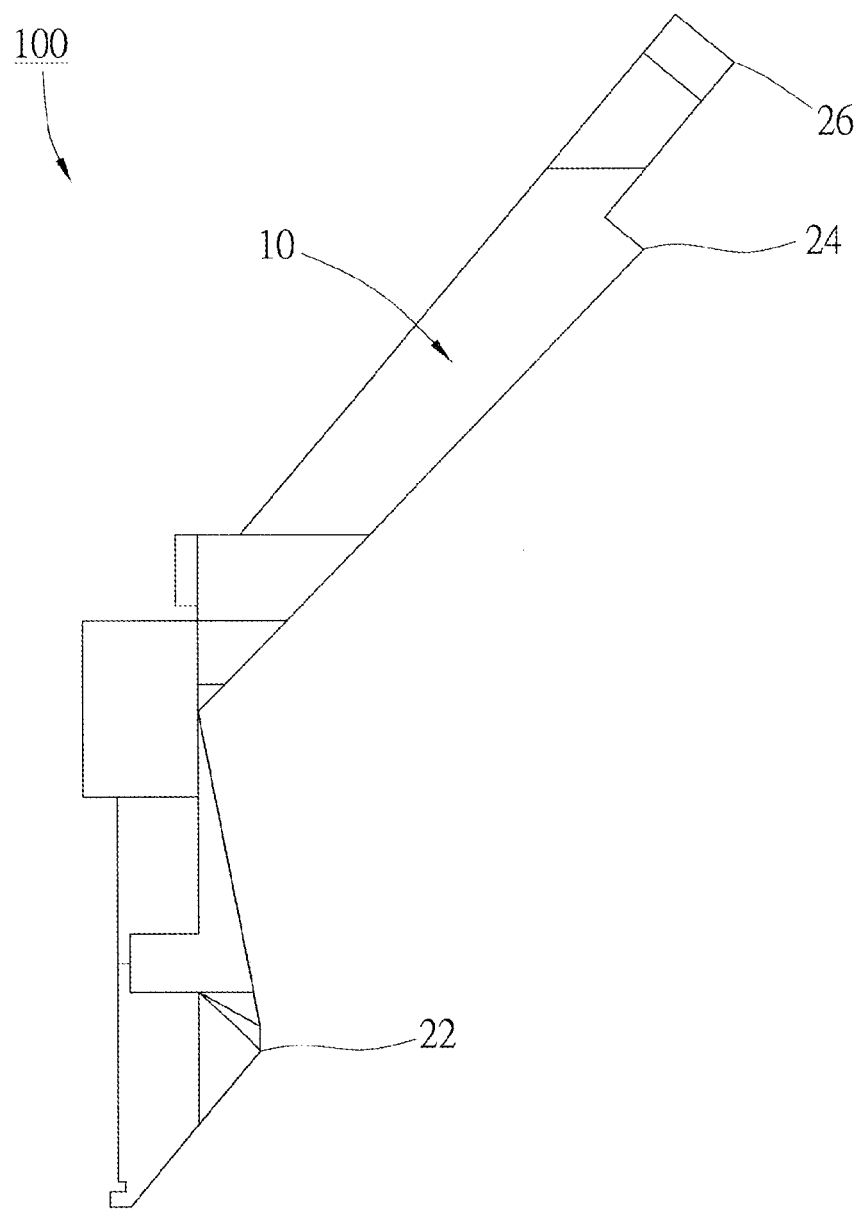
FIG. 3 is a right view of the preferred embodiment of the present invention, showing the probe set on the PCB.
Figure 4:
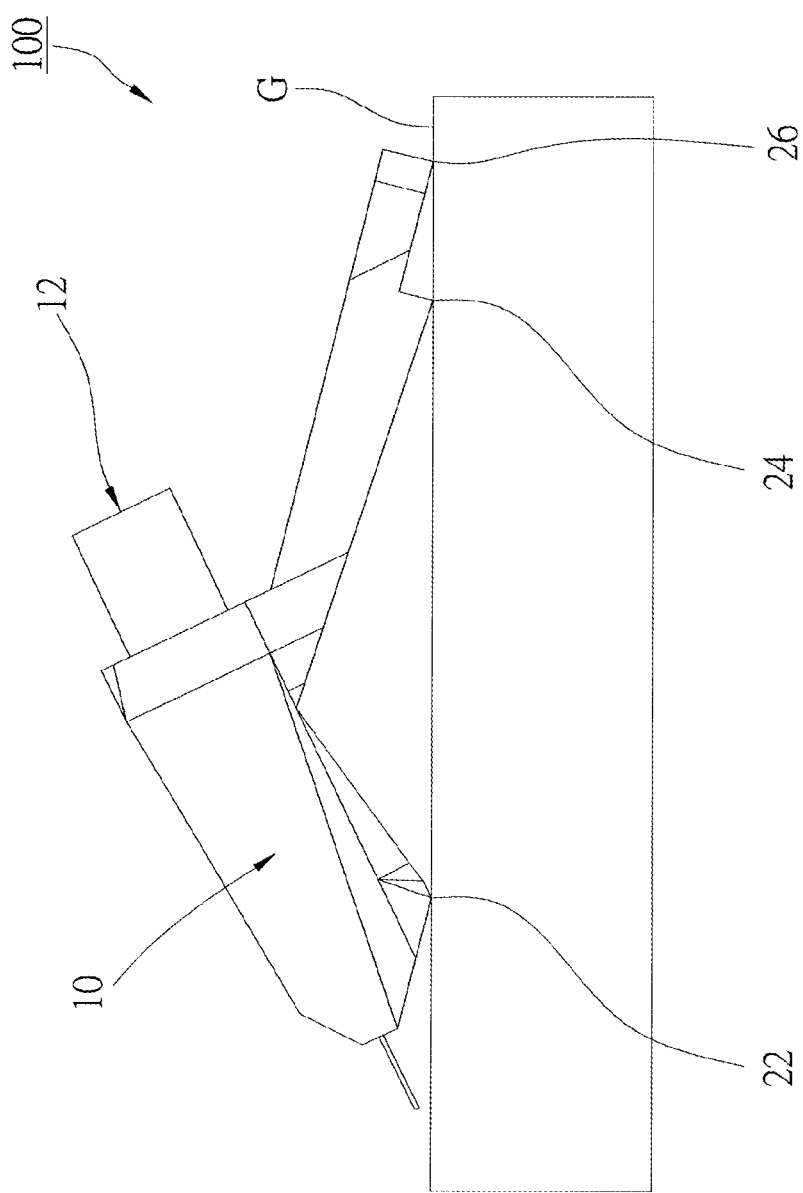
FIG. 4 is a sketch diagram of the preferred embodiment of the present invention, showing the probe module rested on the table.

As shown in FIG. 1 and FIG. 4, a probe module 100 of the preferred embodiment of the present invention, which is adapted to connect to a tester (not shown) and a DUT (not shown) respectively for transmitting electrical signals, includes a case 10, a signal transmitting member 18, a signal connector 12, a signal probe 20, and two grounding probes 21.

The case 10 includes two arms 14, a base 15, and a cover 16. Each arm 14 has an opening 141 for bolts passing though to secure the case 10 on a tester (not shown). The arms 14 each has an end connected to the base 15. The cover 16 has a tapered shape to be engaged with the base 15. The base 15 has a first resting portion 22 at a bottom thereof, and the first resting portion 22 is a protrusion with a tip on the bottom of the base 15. Each arm 14 has a second resting portion 24 and a third resting portion 26 on a bottom. The third resting portion 26 is at a corner of a distal end of the arm 14, and the second resting portion 24 is between the first resting portion 22 and the third resting portion 26. Both the second and the third resting portions 24, 26 are protrusions with tips on the bottom of the arm 14. The tips of the first, the second and the third resting portions 22, 24, 26 are coplanar. In other words, all the tips of the first, the second and the third resting portions 22, 24, 26 lie in a plane.

The signal transmitting member 18 has a circuit board 181 having two grounding circuits 181a and a signal circuit 181b. The circuit board 181 is secured onto the base 15 by bolts 182, and is covered by the cover 16. The signal transmitting member 18 is between the base 15 and the cover 16.

The signal connector 12 is a coaxial cable, having a central core 121, a metallic shield 123, and an isolator 122 between the central core 121 and the metallic shield 123. The core 121 is connected to the signal circuit 181b, and the shield 123 is connected to the grounding circuit 181a.

The signal probe 20 and the grounding probes 21 are made by a conductive material, and each has a tip end 201, 211 are above the plane containing the tips of the first, the second and the third resting portions 22, 24, 26.

The tester generates a test signal, and the test signal is transmitted to the tip end 201 of the signal probe 20 through the core 121 of the signal connector 12 and the signal circuit 181b of the signal transmitting member 18 in sequence. When the tip ends 201 of the signal probe 20 and the tip ends 211 of the grounding probes 21 touch specific pads of the DUT, the test signal is transmitted to the DUT, and then transmitted back to the tester through the grounding probes 21, the grounding circuit 181a of the signal transmitting member 18, and the shield 123 of the signal connector 12 in sequence. As a result, the electrical condition of the DUT is tested.

After test, the probe module 100 is disassembled from the tester, and put on a desk. As shown in FIG. 4, the coplanar tips of the first, the second and the third resting portions 22, 24, 26 will stably rest on a surface G of the desk, and the tip ends 201, 211 of the probes 20, 21 are kept a distance above the surface G that would reduce the chance of damaging the tip ends 201, 211 of the probes 20, 21.

It must be pointed out that the embodiments described above are only some preferred embodiments of the present invention. All equivalent structures which employ the concepts disclosed in this specification and the appended claims should fall within the scope of the present invention.

What is claimed is:

1. A probe module, comprising:
    a case having a first resting portion and a second resting portion, wherein the first resting portion and the second resting portion are coplanar;
    a signal transmitting member provided to the case;
    a signal connector provided to the case, and electrically connected to the signal transmitting member; and
    at least one probe provided to the case, and electrically connected to the signal transmitting member, wherein the probe has a tip end, and the tip end is not in a plane which contains the first resting portion and a second resting portion;
    wherein when the probe module is put on a surface, the first resting portion and the second resting portion rest on the surface to keep the tip end of the probe away from the surface;
    wherein the case comprises an arm and a base, and the arm is connected to the base in a tilted manner; the first resting portion is a protrusion provided on a bottom of the base, and the second resting portion is a protrusion provided on a bottom of the arm.

2. The probe module of claim 1, wherein the signal transmitting member includes a circuit board, and the circuit board has a signal circuit and a grounding circuit; the signal transmitting member has opposite end connected to the probe and the signal connector.

3. The probe module of claim 2, wherein the case has a cover; the circuit is provided on the base; the cover engages the base to cover the circuit board.

4. The probe module of claim 1, wherein the arm further is provided with a third resting portion, and the first resting portion, the second resting portion, and the third resting portion are coplanar.

5. The probe module of claim 2, wherein the at least one probe includes a signal probe and a grounding probe; the signal probe is electrically connected to the signal circuit, and the grounding probe is electrically connected to the grounding circuit.

6. The probe module of claim 5, wherein the signal connector includes a core, a shield, and an insulator between the core and shield; the core, the shield, and the insulator are coaxial; the insulator insulates the core from shield; the core is electrically connected to the signal circuit, and the shield is electrically connected to the grounding circuit.

* * * * *